US009087826B2

(12) United States Patent
Noda

(10) Patent No.: US 9,087,826 B2
(45) Date of Patent: Jul. 21, 2015

(54) METHOD FOR MANUFACTURING SEMICONDUCTOR DEVICE USING MOLD HAVING RESIN DAM AND SEMICONDUCTOR DEVICE

(71) Applicant: Renesas Electronics Corporation, Kawasaki-shi, Kanagawa (JP)

(72) Inventor: Takamitsu Noda, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 0 days.

(21) Appl. No.: 13/850,604

(22) Filed: Mar. 26, 2013

(65) Prior Publication Data
US 2013/0256851 A1    Oct. 3, 2013

(30) Foreign Application Priority Data

Mar. 27, 2012  (JP) ................................ 2012-071563

(51) Int. Cl.
| H01L 23/495 | (2006.01) |
| H01L 21/56 | (2006.01) |
| H01L 23/498 | (2006.01) |
| H01L 23/31 | (2006.01) |

(52) U.S. Cl.
CPC .............. *H01L 23/495* (2013.01); *H01L 21/56* (2013.01); *H01L 21/565* (2013.01); *H01L 23/49894* (2013.01); *H01L 23/3128* (2013.01); *H01L 2224/45144* (2013.01); *H01L 2224/45147* (2013.01); *H01L 2224/48227* (2013.01); *H01L 2924/15159* (2013.01); *H01L 2924/15311* (2013.01)

(58) Field of Classification Search
CPC .................. H01L 23/495; H01L 21/56; H01L 2224/45144; H01L 2924/15311; H01L 2224/48227; H01L 2924/15159; H01L 2224/45147
USPC .................................. 257/667; 438/121–127
See application file for complete search history.

(56) References Cited

U.S. PATENT DOCUMENTS

| 5,927,505 A * | 7/1999 | Chia et al. ..................... 206/710 |
| 7,288,440 B2 | 10/2007 | Kuratomi et al. |
| 7,884,453 B2 * | 2/2011 | Yamano ........................ 257/667 |
| 2002/0109219 A1 * | 8/2002 | Yang et al. .................... 257/712 |

FOREIGN PATENT DOCUMENTS

| JP | 11-163009 | | 6/1999 |
| JP | 2000-058571 A | * | 2/2000 |
| JP | 2000-058571 A | | 2/2000 |

(Continued)

OTHER PUBLICATIONS

Office action dated May 12, 2015 issued in Japanese counterpart application (No. 2012-071563) with English translation.

*Primary Examiner* — Armando Rodriguez
*Assistant Examiner* — Mohammed R Alam
(74) *Attorney, Agent, or Firm* — Womble Carlyle

(57) ABSTRACT

The suppression of resin leakage is combined with the suppression of damage to the functional wiring area of a wiring board in forming an encapsulation resin. A method for manufacturing a semiconductor device includes the step of clamping a wiring board with a first mold and a second mold. The second mold includes: a flat portion contacting a wiring board; a recessed portion forming a cavity to form an encapsulation resin; and a projecting portion formed at a location spaced apart from the recessed portion on the flat portion, the projecting portion projecting on the first mold side, and extending along the first edge of the wiring board.

27 Claims, 9 Drawing Sheets

(56) References Cited

FOREIGN PATENT DOCUMENTS

| JP | 2005-081695 | 3/2005 |
| JP | 2006-313801 A | 11/2006 |
| JP | 2008-066491 | 3/2008 |
| JP | 2012-033584 | 2/2012 |

* cited by examiner

METHOD FOR MANUFACTURING SEMICONDUCTOR DEVICE USING MOLD HAVING RESIN DAM AND SEMICONDUCTOR DEVICE

CROSS-REFERENCE TO RELATED APPLICATION

The disclosure of Japanese Patent Application No. 2012-071563 filed on Mar. 27, 2012 including the specification, drawings, and abstract is incorporated herein by reference in its entirety.

BACKGROUND

The present invention relates to a technique for manufacturing a semiconductor device, and more particularly to a technique that encapsulates an electronic component such as a semiconductor chip mounted on a wiring board with a resin.

For semiconductor packages, there is a single side encapsulation type package including a wiring board, a semiconductor chip mounted on the wiring board, and an encapsulation resin provided on the wiring board so as to cover the semiconductor chip.

In forming the encapsulation resin of this semiconductor package, a mold including a lower mold supporting the back surface side of a wiring board and an upper mold facing the lower mold is used. The upper mold includes a recessed portion forming a cavity surrounding a semiconductor chip and a flat portion contacting the surface of a wiring board around the cavity (see Japanese Unexamined Patent Publication No. 2000-058571 and Japanese Unexamined Patent Publication No. 2006-313801, for example).

The wiring board includes an insulating film, a wiring pattern formed on this insulating film, and a solder resist covering this wiring pattern. The solder resist is formed on projecting portions relatively protruding on the wiring pattern, and formed on recessed portions other than the projecting portions because of the thickness of the wiring pattern. Therefore, a gap is generated between the solder resist and the upper mold on the recessed portion, and a resin sometimes leaks through this gap. On the other hand, in order to suppress the resin leakage, when the upper mold and the lower mold are pressed against each other strongly, the wiring board on the projecting portions is likely to be damaged (for example, Japanese Unexamined Patent Publication No. 2000-058571 and Japanese Unexamined Patent Publication No. 2006-313801).

In view of these problems, Japanese Unexamined Patent Publication No. 2000-058571 describes that a wall-shaped clamp block surrounding the cavity is provided relatively vertically movably to the upper mold, the clamp block is pressed downward using a pressuring mechanism, and the lower end surface of the clamp block is pressed against portions adjacent to the cavity on the top surface of the wiring board for stopping the leakage of a resin. The clamp block described in Japanese Unexamined Patent Publication No. 2000-058571 is disposed at a location adjacent to the cavity, or in the cavity.

It is noted that Japanese Unexamined Patent Publication No. 2005-101407 describes a technique in which a block pin is provided on an upper mold. This block pin contacts the top surface of a lower mold on the outer side of a wiring board, and the lower mold is pressed down in clamping for suppressing the deformation or cracking or the like of the wiring board.

SUMMARY

In the technique described in Japanese Unexamined Patent Publication No. 2000-058571, the clamp block is disposed at a location adjacent to the cavity, or in the cavity.

On the other hand, Japanese Unexamined Patent Publication No. 2005-101407 describes the technique in which the block pin presses down the lower mold for adjusting a contacting pressure across the upper mold and the wiring board.

As described above, it is difficult to combine the suppression of resin leakage with the suppression of damage to the functional wiring area of a wiring board in forming an encapsulation resin.

It is an object of the present invention to provide a technique that can combine the suppression of resin leakage with the suppression of damage to interconnections. The foregoing object, the other objects, and novel features will be apparent from the description and the accompanying drawings of the present specification. For brief description, the summary of representative aspects disclosed in the present application is as follows.

Namely, the present invention is a method for manufacturing a semiconductor device, in which a projecting portion is provided over a flat portion of the upper mold of an encapsulation mold for use in the step of encapsulating a semiconductor device, the flat portion contacts a wiring board around a cavity of the upper mold, and the projecting portion is provided at a location spaced apart from the cavity, and serves as a resin dam.

Moreover, the present invention is directed to a semiconductor device, in which a dent extends at a location spaced apart from an encapsulation resin.

According to the present invention, it is possible to combine the suppression of resin leakage with the suppression of damage to the functional wiring area of a wiring board in forming an encapsulation resin.

DETAILED DESCRIPTION

Figure 1:
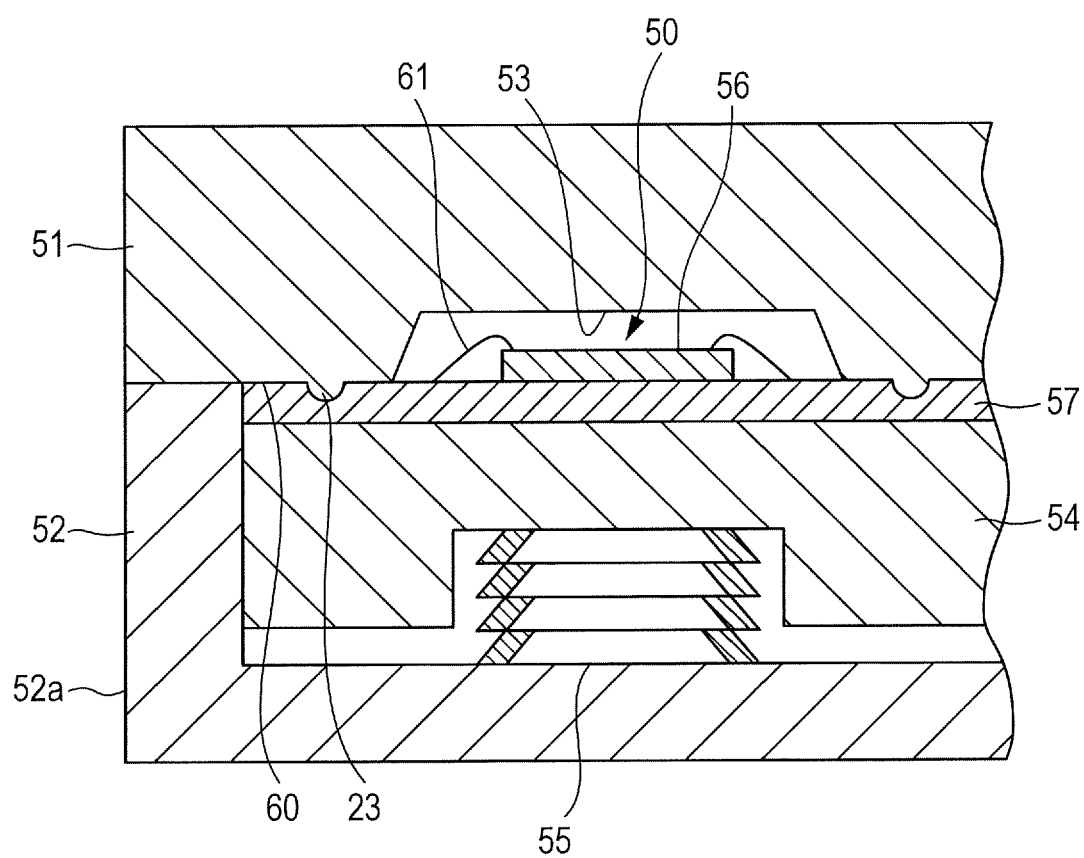
FIG. 1 is a cross sectional view of the configuration of a semiconductor device mold according to a first embodiment.

In the following, embodiments of the present invention will be described with reference to the drawings. It is noted that similar components are designated the same reference numerals and signs, and the description is appropriately omitted in all the drawings.

First Embodiment

Figure 2:
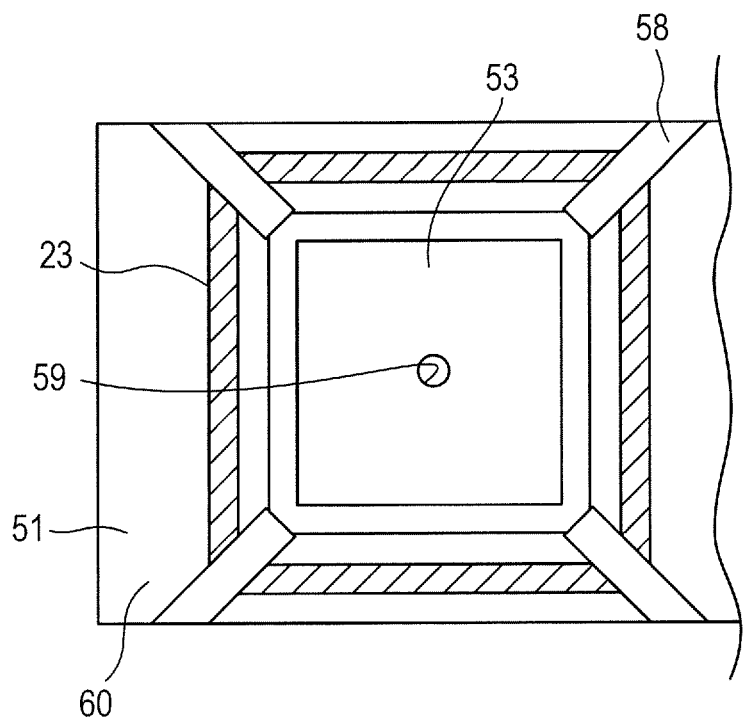
FIG. 2 is a bottom view of an example of a second mold of the semiconductor device mold according to the first embodiment.
Figure 3:
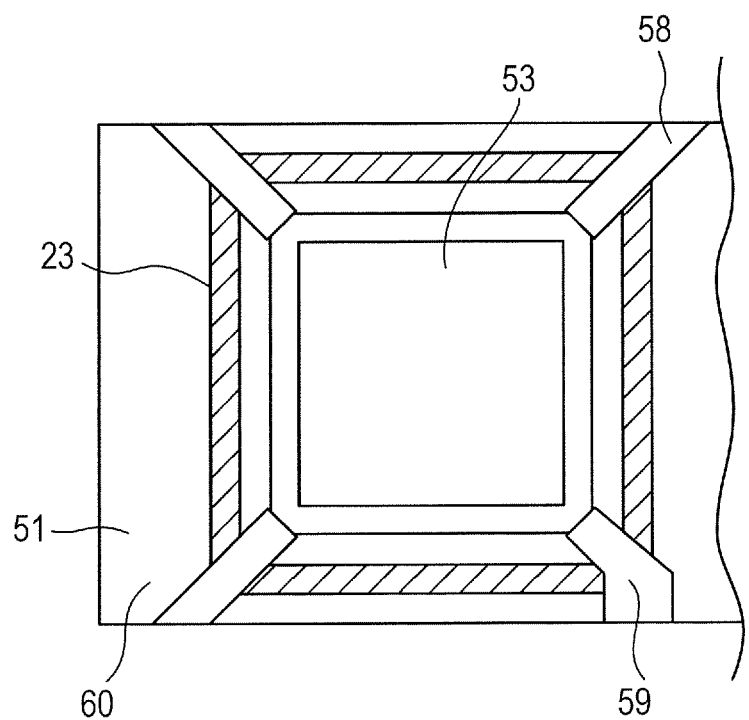
FIG. 3 is a bottom view of another example of the second mold of the semiconductor device mold according to the first embodiment.

FIG. 1 is a cross sectional view of the configuration of a semiconductor device mold according to a first embodiment. FIG. 2 is a bottom view of an example of an upper mold (a second mold) 51 of the semiconductor device mold according to the first embodiment. FIG. 3 is a bottom view of another example of the upper mold 51 of the semiconductor device mold according to the first embodiment. It is noted that a projecting portion 23 is hatched in FIGS. 2 and 3 for easily understanding the location of the projecting portion 23.

The semiconductor device mold according to the embodiment includes a first mold (a lower mold 52, for example) that contacts the back surface (a second surface) of a wiring board 57 on which a semiconductor chip 56 is mounted in clamping and the second mold (the upper mold 51, for example) facing the first mold. The second mold includes a recessed portion 53 that forms a cavity 50 surrounding the semiconductor chip 56 in clamping and a flat portion 60 that contacts the surface (a first surface) of the wiring board 57 around the cavity 50 in clamping. The flat portion 60 is provided with a projecting portion 23 that projects on the wiring board 57 side at a location spaced apart from the cavity 50 in such a way that the projecting portion 23 extends in an annular shape surrounding the cavity 50. As described further below, the projecting portion 23 serves as a resin dam preventing leakage of the resin past the projecting portion, when resin is introduced into the cavity during a molding process.

The lower mold 52 includes a main body 52a, a cavity block 54, and a coned disc spring 55, for example. The main body 52a is formed in a half-box shape in which the top end is opened. The cavity block 54 is disposed in the main body 52a so as to be vertically slidable along the inner edge of the main body 52a. The coned disc spring 55 is disposed between the bottom surface of the hollow portion of the main body 52a and the lower surface of the cavity block 54 in the state in which a plurality of the coned disc springs 55 are stacked, and the coned disc springs 55 spring-bias the cavity block 54 upward.

The cavity block 54 and the coned disc springs 55 form a pressure release mechanism (a floating mechanism). Even though the thickness of the wiring board 57 fluctuates, the fluctuation in the thickness of the wiring board 57 is absorbed by the floating mechanism, and the wiring board 57 can be clamped with an appropriate load.

As described above, the upper mold 51 includes the recessed portion 53 and the flat portion 60.

The shape of the recessed portion 53 is rectangular when seen in a plane view, for example, and has a trapezoidal cross section.

The flat portion 60 is provided with the projecting portion 23 projecting on the wiring board 57 side in such a way that the projecting portion 23 extends in an annular shape surrounding the cavity 50. It is noted that in the case of the embodiment of FIG. 1, the entire upper mold 51 including the projecting portion 23 is integrally formed of a metal, for example, to have unitary one-piece construction.

Here, in the upper mold 51, there is a region in which the projecting portion 23 is not formed in at least a part of the region facing the angled short side of an encapsulation resin forming region 64, described later. Moreover, the height of the projecting portion 23 projecting from the flat portion 60 is shorter than the thickness of a solder resist 72 on an interconnection 71a, described later.

Figure 10:
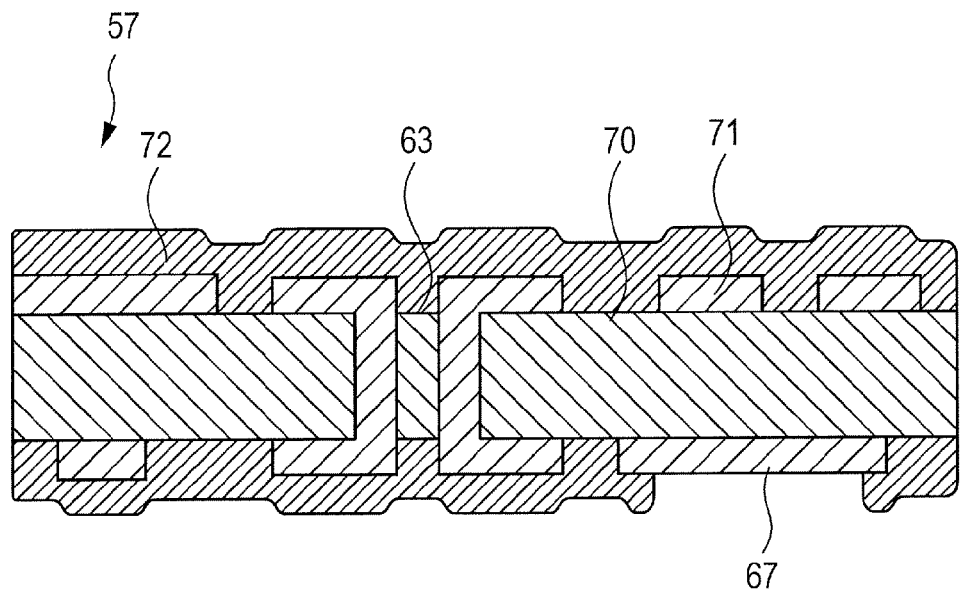
FIG. 10 is a cross sectional view of a wiring board.

Here, FIG. 10 is a cross sectional view of the wiring board 57. As illustrated in FIG. 10, the wiring board 57 includes a base substrate 70, an interconnection 71 (a functional interconnection 66, described later) and a through hole 63 formed on the base substrate 70, and the solder resist (the insulating resin) 72 that covers the interconnection 71 and the through hole 63.

Figure 11:
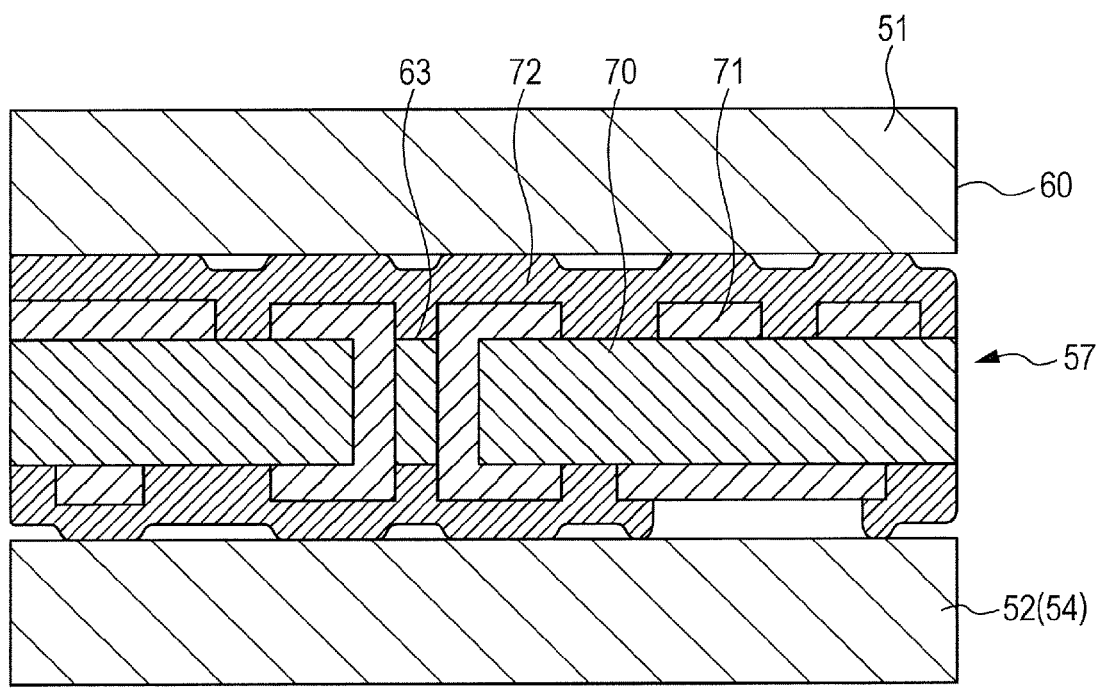
FIG. 11 is a cross sectional view for describing a problem of a method for manufacturing a semiconductor device according to a comparative example.

The surface of the wiring board 57 has micro projections and depressions reflecting the shape of the interconnection 71 and the like as illustrated in FIG. 10, for example. The solder resist 72 in liquid is applied over the base substrate 70 having the pattern of the interconnection 71 formed on the surface of the base substrate 70 using a roll coater or a print screen, and then the solder resist 72 is cured. Although the solder resist 72 has certain flatness when applied, the volume of the solder resist 72 is reduced when cured because of the volatilization of a solvent in the solder resist or the reaction of contraction. In reducing the volume, since the thickness of the solder resist 72 in the region where there is no interconnection 71 is larger than the thickness of the solder resist 72 on the interconnection 71, the volume is more greatly reduced. Therefore, the shape reflects the shapes of the projections and depressions such as the interconnection 71. Since the floating mechanism can only absorb micro fluctuations in the thickness of the substrate, a gap is generated between the flat portion 60 of the upper mold 51 and the wiring board 57 as illustrated in FIG. 11 when using the upper mold 51 with no projecting portion 23 formed on the flat portion 60. In the case where this gap extends from the region inside the recessed portion (the cavity) 53 formed on the upper mold 51 to an external region, it is difficult to suppress the occurrence of resin leakage along the gap. Moreover, when one tries to suppress resin leakage by applying a heavier load in clamping, stress is concentrated on projecting portions of the micro projections and depressions of the wiring board 57, and cracks are formed on the wiring board 57 (cracks on the solder resist 72 or the breakage of the interconnection 71, for example).

For these problems, in the embodiment, the projecting portion 23 is formed on the flat portion 60 of the upper mold 51. In clamping, the projecting portion 23 is pressed against the surface of the wiring board 57 together with the flat portion 60, and a clamping pressure is applied to the region on the wiring board 57 in which the projecting portion 23 contacts the wiring board 57; the clamping pressure is larger than a clamping pressure in the region on the wiring board 57 in which the flat portion 60 contacts the wiring board 57. Thus, even in the case where the gap reflecting the shape of the interconnection 71 extends from the region inside the recessed portion 53 formed on the upper mold 51 to the external region, resin leakage to the outer side can be suppressed beyond the contacting portions between the projecting portion 23 and the wiring board 57.

Moreover, in the embodiment, the flat portion 60 of the upper mold 51 contacts the wiring board 57, and the projecting portion 23 also contacts the wiring board 57. In the case where only the projecting portion 23 of the upper mold 51 contacts the wiring board 57, only the contacting region of the projecting portion 23 receives a clamping pressure (the resistance of the plate springs 55, for example) when the wiring board 57 has micro fluctuations in the thickness of the substrate, so that it is likely that a large pressure is locally applied and the wiring board 57 is damaged. On the contrary, when the flat portion 60 contacts the wiring board 57 together with the projecting portion 23 to clamp the wiring board 57, the clamping pressure can be received in a wide area, and the damage to the wiring board 57 caused by the clamping pressure can be suppressed.

In the contacting area between the wiring board 57 and the upper mold 51, the contacting area between the flat portion 60 and the wiring board 57 is made larger than the contacting area between the projecting portion 23 and the wiring board 57, and this is preferable from the points of both of the suppression of resin leakage and the damage to the wiring board.

Furthermore, since the projecting portion 23 is provided at a location spaced apart from the cavity 50, damage to the functional interconnection of the wiring board 57 (the detail will be described later) by the projecting portion 23 is suppressed.

In addition, the projecting portion 23 may be disposed in such a way that the region in which the flat portion 60 contacts the wiring board 57 exists on both of the inner side and the outer side of the region in which the projecting portion 23 contacts the wiring board 57. Particularly, preferably, the flat portion 60 is formed in such a way that the flat portion 60 includes a first portion on the inner side of the projecting portion 23 and a second portion on the outer side of the projecting portion 23, relative to the cavity 50, in the same plane. Thus, variations in a pressure on the first portion on the inner side of the projecting portion 23 in the flat portion 60 and on the second portion on the outer side of the projecting portion 23 in the flat portion 60 can be suppressed.

As illustrated in FIG. 2 or FIG. 3, the upper mold 51 is formed with a gate 59 that serves as an inlet port for filling a resin in the cavity 50 and is further formed with an air vent 58 that serves as an outlet port to release air in the cavity 50 when filling a resin. It is noted that FIG. 2 is a so-called top gate upper mold 51 in which the gate 59 is formed on the upper part. In this example, four air vents 58 are formed at four corners of the recessed portion 53 forming the cavity 50 (FIG. 1) in such a way that the air vents 58 communicate with each other. Moreover, FIG. 3 is a so-called side gate upper mold 51 in which the gate 59 is formed on the side portion. In this example, the gate 59 communicates with one of four corners of the recessed portion 53, and three air vents 58 communicate with the remaining three corners. In the upper mold 51, the air vents 58 and the gate 59 of the side gate type are configured as grooves formed on the flat portion 60. The groove forming the gate 59 is deeper than the groove forming the air vent 58. Furthermore, the width of the groove forming the gate 59 may be formed wider than the width of the groove forming the air vent 58 in the flat portion 60. In the embodiment, the projecting portion 23 is interrupted at the locations to form the air vents 58. As described above, no projecting portion 23 exists at at least a part of the locations at which the air vents 58 are formed, so that air pressed in filling a resin can be reliably released out. It is noted that in the case of the top gate type, the gate 59 may not be necessarily disposed in the center of the recessed portion 53 when seen in a plane view. Similarly, in the case of the side gate type, the gate 59 may not be necessarily disposed on the corner of the recessed portion 53.

Figure 4A:
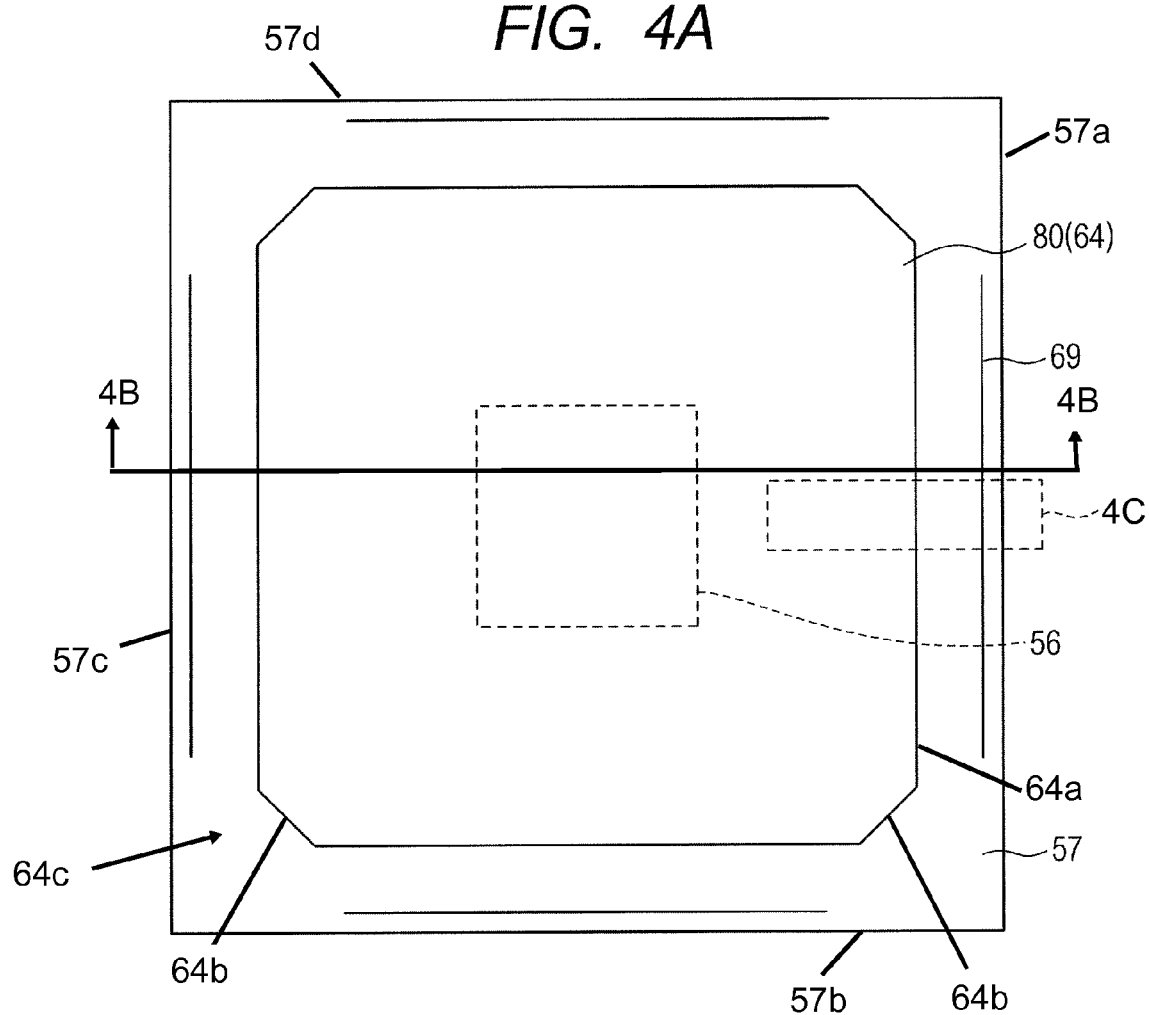
FIGS. 4A to 4D are diagrams of a semiconductor device according to the first embodiment.
Figure 4B:
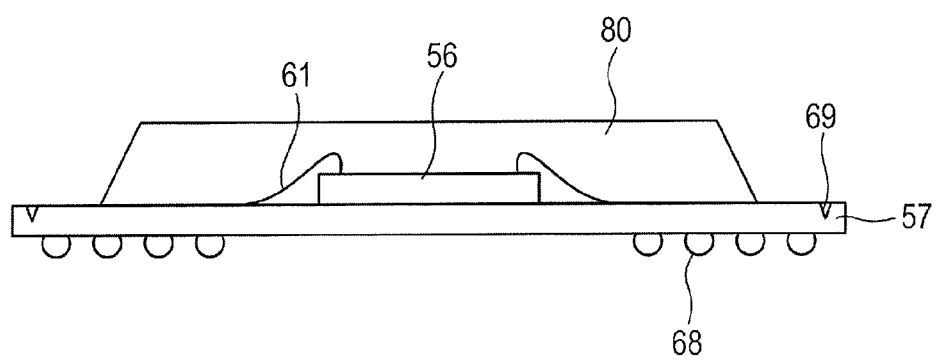
Figure 4C:
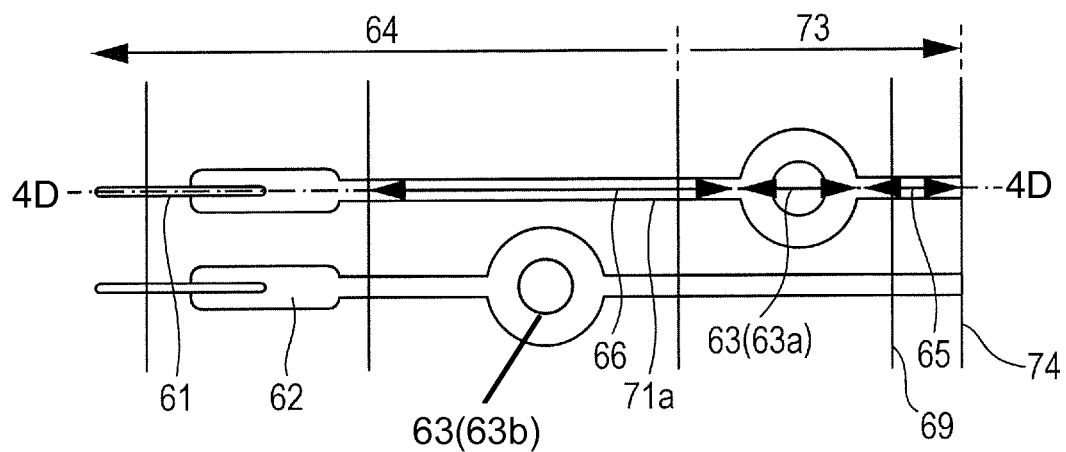
Figure 4D:
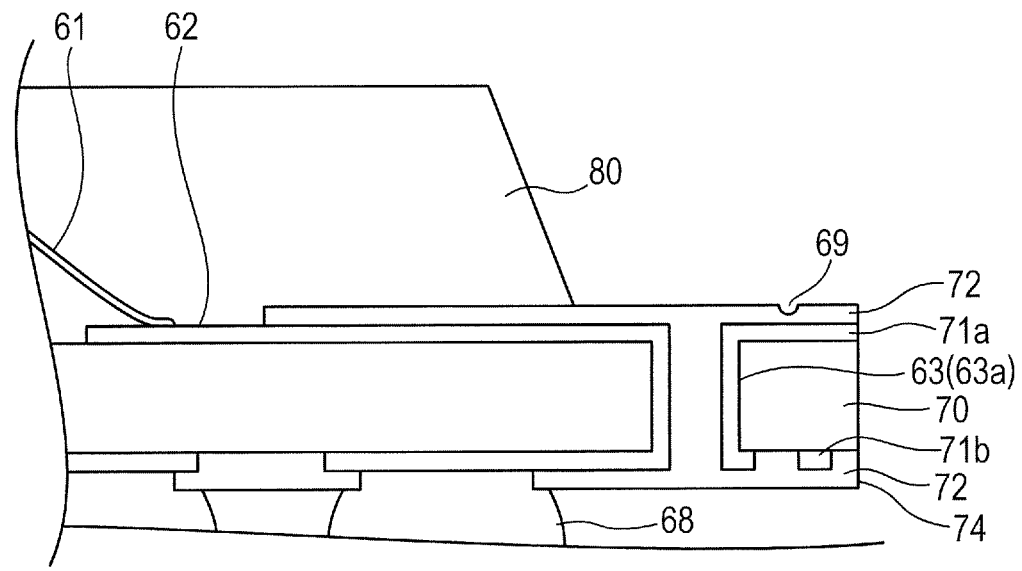

The semiconductor device according to the embodiment will be described with reference to FIGS. 4A to 4D. FIG. 4A is a plan view of the semiconductor device according to the embodiment. FIG. 4B is a cross sectional view of the semiconductor device of FIG. 4A along line 4B-4B. FIG. 4C is a schematic enlarged diagram of a portion 4C in FIG. 4A. FIG. 4D is a cross sectional view along a line 4D-4D in FIG. 4C. It is noted that FIG. 4C illustrates the interconnection 71a through an encapsulation resin 80, described later, and the solder resist 72.

The semiconductor device according to the embodiment includes the wiring board 57, the semiconductor chip (the semiconductor device) 56, the encapsulation resin 80, a solder ball (an external terminal) 68, and a dent 69. The wiring board 57 includes the first surface (the top surface) and the second surface (the back surface) that is a surface on the opposite side of the first surface. The outline of the wiring board 57 when seen in a plane view includes a first edge 57a. More specifically, the wiring board 57 is quadrilateral. The outline of the wiring board 57 when seen in a plane view includes four edges, marked 57a, 57b, 57c, 57d in FIG. 4A. It is noted that the shapes at the intersection points (the corners of the quadrilateral) between the first edge and the adjacent edges are not necessarily the shapes crossing at a right angle. The shapes may include notches. The first surface includes a first region (the encapsulation resin forming region 64) and a second region (a peripheral region 73) surrounding the first region. The semiconductor chip 56 is mounted on the encapsulation resin forming region 64. The encapsulation resin 80 is not formed on the peripheral region 73, but formed on the encapsulation resin forming region 64, and encapsulates the semiconductor chip 56. The solder ball 68 is formed on the back surface of the wiring board 57. The dent 69 is formed at a location spaced apart from the encapsulation resin forming region 64 in the peripheral region 73, and extends along the first edge of the wiring board 57. In the following, the configuration will be described in detail.

The semiconductor device according to the embodiment includes the wiring board 57 including the encapsulation resin forming region 64 and the peripheral region 73 surrounding the encapsulation resin forming region 64 on the top surface, the semiconductor chip 56 mounted on the encapsulation resin forming region 64 of the wiring board 57, and the encapsulation resin 80 formed on the encapsulation resin forming region 64 of the wiring board 57 to cover the semiconductor chip 56. The dent 69 is formed on the surface of the peripheral region 73 along the outer edge of the wiring board 57. The dent 69 is formed by transferring the projecting portion 23 of the resin encapsulation mold for use in encapsulating the encapsulation resin 80; the projecting portion 23 is formed on the surface of the resin encapsulation mold, and the surface contacts the wiring board 57.

In the embodiment, the encapsulation resin forming region 64 has a quadrilateral shape with chamfered corners 64c. Four sides of the quadrilateral are formed nearly in parallel with the edges of the rectangular wiring board 57, and the corners (chamfered regions) 64c are disposed at the locations facing the corners of the wiring board. In other words, the encapsulation resin forming region 64 has an octagon comprising long sides 64a alternating with angled short sides 64b, including two pairs of long sides facing each other and two pairs of angled short sides facing each other. The long sides facing each other extend in parallel with each other, and the angled short sides facing each other extend in parallel with each other. The long sides extend in parallel with the four edges of the wiring board 57, and the angled short sides face the corners of the wiring board 57.

The first long side 64a of the octagon of the encapsulation resin forming region 64 and the first edge 57a of the wiring board 57 are located on the same side relative to the encapsulation resin forming region 64 when seen in a plane view, and are in parallel with each other. The dent 69 and the first long side 64a extend in parallel with each other. A first distance between the first long side 64a and the dent 69 is longer than a second distance between the first edge of the wiring board 57 and the dent 69. On the wiring board 57, there is the region in which the dent 69 is not formed in at least a part of the region corresponding to the angled short side 64b of the encapsulation resin forming region 64.

The encapsulation resin forming region 64 is defined by the recessed portion 53 of the upper mold 51. More specifically, the encapsulation resin forming region 64 is defined by lines where the side surfaces of the recessed portion 53 intersect with the flat portion 60. The encapsulation resin forming region 64 is the region facing the recessed portion 53 of the upper mold 51 on the top surface of the wiring board 57 when forming the encapsulation resin 80. The peripheral region 73 is the region in which the flat portion 60 and the projecting portion 23 of the upper mold 51 contact the top surface of the wiring board 57. The cross section of the encapsulation resin 80 is trapezoidal, and the lower bottom of the trapezoid corresponds to the encapsulation resin forming region 64. The encapsulation resin 80 is not formed on the peripheral region 73.

The wiring board 57 includes the base substrate 70 including an insulating material like a glass epoxy plate, the interconnection 71a including a conductor formed on the top surface of the base substrate 70 (on the surface on which the encapsulation resin 80 is formed), a plurality of the through holes 63 including a through hole penetrating through the base substrate 70 and a conductor formed on the inner wall of the through hole, and the solder resist (the first insulating film) 72 formed on the base substrate 70 and the interconnection (the first interconnection) 71a, for example. The dent 69 is formed on the solder resist 72 on the top surface of the wiring board 57. The depth of the dent 69 is shallower than the thickness of the solder resist 72 on the interconnection 71a.

An interconnection (a second interconnection) 71b is formed on the lower surface of the base substrate 70. The first (upper) interconnection 71a and the second (lower) interconnection 71b are electrically coupled to each other through the through hole 63. The solder resist (the second insulating film) 72 is formed also on the lower surface of the base substrate 70 so as to cover the interconnection 71b. In the embodiment, the conductor forming the interconnections 71a and 71b and the through hole 63 is Cu (copper) or an alloy having Cu as a principal component.

A part of the solder resist 72 is opened (removed) on the top surface of the wiring board 57, and a part of the first interconnection 71a is exposed, so that a stitch (a first electrode terminal) 62 is formed. A metal film (not illustrated) excellent in joining a bonding wire 61, described later, is formed on the surface of the stitch 62. The metal film is formed of an Ni (nickel) plating layer formed on the interconnection 71a by electroplating and an Au (gold) plating layer formed on the Ni plating layer.

The wiring board 57 is formed with the through holes 63. The through holes 63 are coupled to the corresponding stitches 62 through the interconnection 71a (the functional interconnection 66, described later). One ends of the bonding wires 61 are bonded to the stitches 62, and the other ends of the bonding wires 61 are bonded to electrode pads (not illustrated) on the top surface of the semiconductor chip 56. The bonding wire 61 is a metal fine wire having Au or Cu as a principal component.

A part of the solder resist 72 is opened (removed) also on the lower surface of the wiring board 57, and a part of the lower interconnection 71b is exposed, so that a ball land is formed. The solder ball (the external terminal) 68 is formed on the ball land. The solder ball 68 is used for coupling the semiconductor device to another electronic device. A barrier metal formed of an Ni electroplating layer formed in forming the metal film of a bonding finger may be provided on the joining interface between the ball land and the solder ball 68. In other words, the electrode pad of the semiconductor chip 56 is electrically coupled to the solder ball 68 through the bonding wire 61, the interconnection 71a, the through hole 63, and the interconnection 71b.

The solder ball 68 located on the outermost peripheral portion when seen in a plane view is located on the encapsulation resin forming region 64 on the inner side of the dent 69. In other words, the outermost solder ball 68 is not formed between the dent 69 and the first edge of the wiring board 57.

Moreover, the wiring board 57 includes the through holes 63. Some of the through holes 63 are located in the encapsulation resin forming region 64 (the through holes 63b on the lower side in FIG. 4C), and some are located in the peripheral region 73 (the through holes 63a on the upper side in FIG. 4C), for example. The through holes 63 include a first through hole 63a located on the portion in the peripheral region 73 between the encapsulation resin forming region 64 and the dent 69 when seen in a plane view.

The wiring board 57 includes the stitches 62 in the encapsulation resin forming region 64. The interconnection 71a extends from the stitch 62 to the first through hole 63a. The wiring board 57 further includes a plating wire 65 reaching the first edge of the wiring board 57 from the first through hole 63a in the peripheral region 73.

Next, an example of a more specific arrangement of the interconnection 71a and the projecting portion 23 will be described.

As illustrated in FIG. 4C, the interconnection 71a includes the functional interconnection (the first interconnection) 66 coupling the stitch 62 to the first through hole 63a, and the plating wire (the second interconnection) 65 extending from the first through hole 63a to the outer edge of the wiring board 57 (the edge of the wiring board 57 when seen from the top surface). The functional interconnection 66 is an interconnection necessary to operate the semiconductor device, forming a part of a path electrically coupling the solder ball 68, which is an external terminal, to the electrode pad of the semiconductor chip 56 (not illustrated in FIG. 4C). The plating wire 65 is an interconnection to feed power for plating in forming the metal film described above on the stitch 62 by electroplating. The plating wire 65 is an unnecessary interconnection after plating.

In the embodiment, the semiconductor device includes the functional interconnection 66 not intersecting with the dent 69 and the plating wire 65 intersecting with the dent 69. A pressure larger than a pressure in the region contacting the flat portion 60 is applied to the dent 69; the region is a region deformed by contacting the projecting portion 23 of the upper mold 51. The plating wire 65, which causes no problem in operating the semiconductor device when damaged (since the plating wire 65 is not used after the plating process), is disposed in the region, and the functional interconnection 66 is disposed only in the region on the inner side of the plating wire 65. Therefore, a highly reliable semiconductor device can be obtained while effectively using the area on the wiring board 57.

Here, in the case of using an encapsulation mold (a semiconductor device mold) with no projecting portion 23, interconnections in the entire region contacting the mold in a semiconductor device are likely to be damaged. Particularly, in the boundary between the peripheral region 73 and the encapsulation resin forming region 64, large damage is likely to be caused because the edge of the recessed portion of the mold contacts the wiring board 57 in the boundary. When a functional interconnection passing through the boundary is damaged, the semiconductor device may not be operated. The interconnection and the dent 69 are disposed as described above, so that it is possible to combine the suppression of burrs with the reliability of the semiconductor device.

Here, the region surrounded by the dents 69 is referred to as an effective wiring area. Since the effective wiring area contacts the flat portion 60, and not the projecting portion 23, the effective wiring area is a region with a small possibility of damaging interconnections. Therefore, as the effective wiring area is widened (as the region of forming the dent 69 is brought closer to the outer edge of the wiring board 57), higher reliability can be implemented with a smaller design constraint.

The dent 69 is transferred and formed by pressing the projecting portion 23 against the solder resist 72 formed on a nearly flat shape. In forming the dent 69, fine cracks are formed on the solder resist 72 depending on the height of the projecting portion 23, and a part of the conductor might be exposed. When the conductor is exposed, electrical short circuits are likely to increase between the adjacent conductors. Thus, preferably, the projecting portion 23 is pressed against the solder resist 72 to a degree that does not expose the conductor.

Figure 5A:
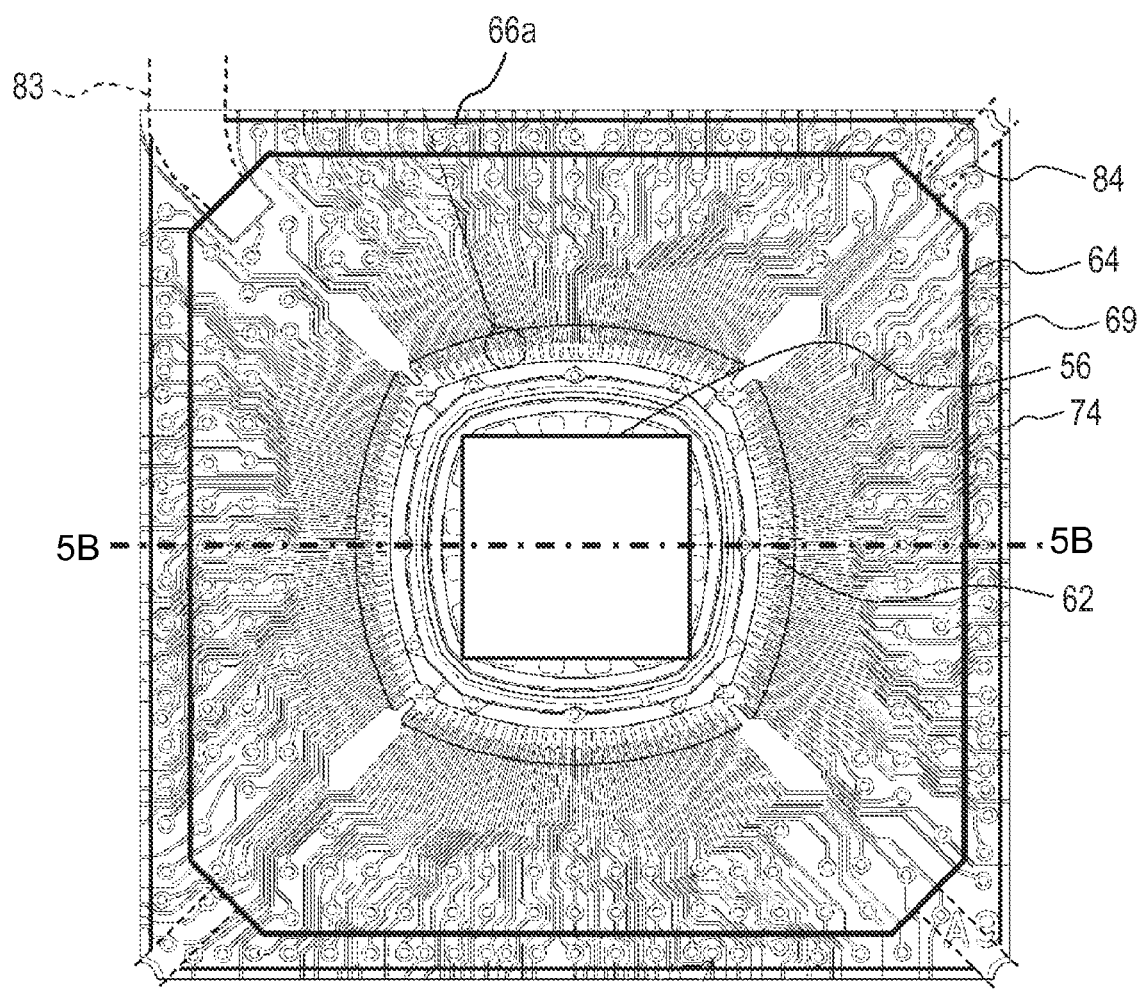
FIGS. 5A and 5B are diagrams of the semiconductor device according to the first embodiment.
Figure 5B:
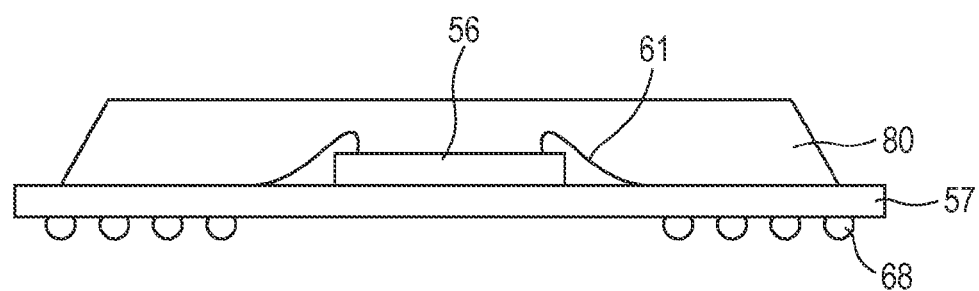

FIG. 5A is a schematic plan view for describing the operation and effect of the semiconductor device according to the embodiment. FIG. 5B is a cross sectional view along a line 5B-5B in FIG. 5A. A gate pattern is formed on the corner on the upper left (in a location 83 indicated by dotted line) in the drawing among the four corners of the wiring board 57. Since a solder resist is not formed on the gate pattern and a metal film is exposed, the dent 69 is not basically formed on the corner, but a partial contact mark may be formed. An air vent is formed on the remaining three corners (in locations 84 indicated by dotted lines). Since the solder resist is formed on the air vents, the dents 69 may be formed on the air vents. However, in the embodiment, the dents 69 are not formed to secure the release of air in encapsulation.

All the through holes 63 do not necessarily include the plating wire 65 in the peripheral region 73. For example, the plating wire 65 may be formed on the lower surface of the wiring board (not illustrated), or the plating wire 65 may be branched from the region closer to the stitch on the inner side of the through hole, that is, the plating wire 65 may be branched from the functional interconnection (not illustrated).

Moreover, the number of the conductor layers of the wiring board 57 is not limited to two layers. The wiring board 57 may have three conductor layers or more. In this case, the conductor layer the closest to the chip on the wiring board is a layer including the first interconnection.

A distance from the dent 69 to a wiring board end 74 is 100 μm or more, preferably, 300 μm or more. Since the encapsulation mold is generally heated, the disposed wiring board 57 is also deformed by heat. In the embodiment, when the projecting portion 23 is located at a location shifted on the wiring board 57 (particularly, at the position of the slit on a processed substrate, described later), it is difficult to suppress the formation of a thin resin bun 75 (FIG. 6B). However, the distance is secured, so that the projecting portion 23 can reliably contact the wiring board 57 even though the wiring board 57 includes slits.

The flat portion 60 of the upper mold 51 is provided with the projecting portion 23 projecting on the wiring board 57 side at a location spaced apart from the cavity 50 in such a way that the projecting portion 23 extends in an annular shape surrounding the cavity 50.

Alternatively, more preferably, the projecting portion 23 is disposed at a location at which the projecting portion 23 contacts the portion on the outer side of the through hole 63 on the outermost peripheral portion on the wiring board 57 (the through hole 63a in FIG. 4C). Also with this configuration, damage to the functional interconnection 66 in the effective wiring area, by the projection portion 23, is suppressed. Here, in principle, the functional interconnection 66 is not disposed on the outer side of the through hole 63a on the outermost peripheral portion. However, from design constraints, some of a plurality of the functional interconnections 66 are partially routed on the outer side of the through hole 63a on the outermost peripheral portion, like the functional interconnection 66a in FIG. 5A.

Alternatively, preferably, the projecting portion 23 is disposed at a location spaced apart from the recessed portion 53 forming the cavity 50 by 0.5 mm or more. In other words, preferably, the projecting portion 23 is disposed at a location on the outer side of the encapsulation resin forming region 64 illustrated in FIG. 4C by 0.5 mm or more. Also with this configuration, damage to the functional interconnection 66 in the functional wiring area, by the projecting portion 23, is suppressed.

Next, the amount of the projecting portion 23 projecting from the flat portion 60 will be described.

The flat portion 60 is sometimes mirror-finished, or satin-finished. In the case where the flat portion 60 is minor-finished, the surface roughness of the flat portion 60 (ten point height of irregularities Rz) is about 1 μm, for example. Preferably, the amount of the projecting portion 23 projecting in this case is 1 μm or more. Moreover, in the case where the flat portion 60 is satin-finished, the surface roughness of the flat portion 60 (ten point height of irregularities Rz) is about 5 to 10 μm, for example. Preferably, the amount of the projecting portion 23 projecting is 5 μm or more. Also in these cases, the projecting portion 23 can be distinguished because the projecting portion 23 extends (the projecting portion 23 is formed continuously). The projecting portion 23 can be pressed against the wiring board 57 with sufficient force at least in the region in which the projecting portion 23 is formed, and resin leakage through the gap between the projecting portion 23 and the wiring board 57 can be suppressed.

Preferably, the amount of the projecting portion 23 projecting from the flat portion 60 is lower than the thickness of the solder resist on the interconnection on the wiring board to be encapsulated. Thus, the interconnection is prevented from being exposed through the solder resist. Moreover, preferably, the amount of the projecting portion 23 projecting is 30 μm or less. Thus, the deformation or cracking or the like of the wiring board 57 can be suppressed.

It is noted that FIG. 5A illustrates a gate facing region 83 that is a region facing the gate 59 of the upper mold 51 and an air vent facing region 84 that is a region facing the air vent 58 of the upper mold 51 by dotted lines.

Figure 6A:
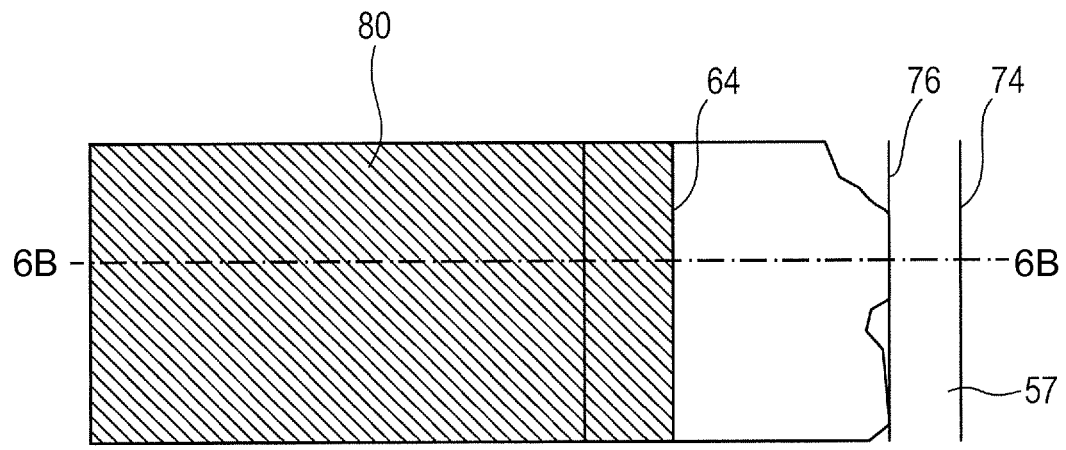
FIGS. 6A and 6B are diagrams of a semiconductor device according to an exemplary modification.
Figure 6B:
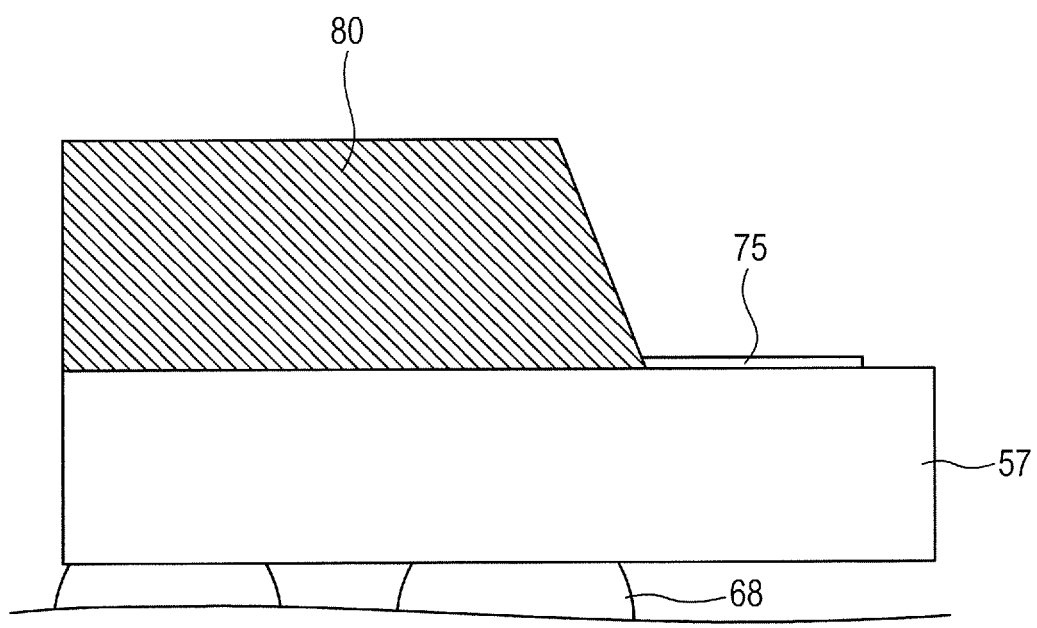

FIGS. 6A and B are diagrams for describing a semiconductor device according to an exemplary modification. FIG. 6A is a plan view, and FIG. 6B a cross sectional view along a line 6B-6B in FIG. 6A. The only point different from the other embodiments is in that a thin resin bun 75 is formed; the thin resin burr 75 extends to the region where a projecting portion 23 contacts a wiring board 57. The thin resin bun 75 is formed on a peripheral region 73 between a dent 69 and an encapsulation resin forming region 64, and the thin resin bun 75 is not formed on the peripheral region 73 on the first edge side of the wiring board 57 on the outer side of the dent 69. This is because the projecting portion 23, upon contact with the solder resist 72, forms a resin dam, preventing the resin from leaking past the projecting portion contact line 76.

A contacting pressure across the flat portion 60 and the wiring board 57 is made smaller, so that the semiconductor device according to the embodiment can be obtained. The thin resin bun 75 is formed by leaking encapsulation resin 80. However, the density of a filler including silicon oxide (silicon) or the like contained in the encapsulation resin 80 (a filler area ratio per unit area observed in a given cross section, for example) is smaller in the thin resin burr 75 than the density of the encapsulation resin 80 on the encapsulation resin forming region 64. This is because it is difficult for the filler to enter the gap between the flat portion 60 and the wiring board 57. Alternatively, the average filler diameter is smaller in the thin resin bun 75 than in the encapsulation resin 80 on the encapsulation resin forming region 64.

A part of the thin resin bun 75 reaches a projecting portion contact line 76 that is a line at which the projecting portion 23 contacts the wiring board 57 (corresponding to the dent 69) when seen in a plane view. In the region, the thin resin burr 75 includes a linear portion in parallel with the edge of the wiring board 57.

In the embodiment, one can reliably suppress the thin resin bun 75 from extending on the outer side of the projecting portion contact line 76, while permitting a wide formation of the thin resin bun 75 on the peripheral region 73 of the wiring board 57. Since a pressure applied to the region of the projecting portion 23 can be made smaller than a pressure in the other embodiments, the wiring board 57 can be prevented from damage, even in the case where the thickness of the solder resist 72 on the conductor is below 20 μm, for example.

In some embodiments, the dent 69 may not be formed. Even though the clamping pressure may not form the dent 69 (a pressure may be absorbed by the elastic deformation of the solder resist 72), a pressure is concentrated on the projecting portion contact line 76, so that the thin resin bun 75 can be reliably prevented from extending on the outer side of the dent 69. Thus, on the wiring board 57, any thin resin burrs 75 extend no further from the encapsulation resin 80 than an imaginary line (the projecting portion contact line 76) which extends along and between a long side 64a of the encapsulation resin 80 and the first edge 57a of the wiring board 57. This is because the projecting portion 23, upon contact with the solder resist 72 during clamping and encapsulation, forms a resin dam which prevents the resin from leaking past the projecting portion contact line 76. It is noted that in the case where the thin resin burr 75 is too thick, the thin resin burr 75 exhibits a color tone close to the color of the encapsulation resin 80, and a solid appearance is also changed. Therefore, the thickness of the thin resin burr 75 is preferably 10 μm or less, more preferably, 5 μm or less.

Next, a method for manufacturing a semiconductor device according to the embodiment will be described. The manufacturing method includes the steps of: preparing the wiring board 57; mounting the semiconductor chip 56 on the encapsulation resin forming region 64 of the wiring board 57; clamping the wiring board 57 on which the semiconductor chip 56 is mounted; and encapsulating the semiconductor chip 56 with the encapsulation resin 80. The wiring board 57 includes the top surface including the encapsulation resin forming region 64 and the peripheral region 73 surrounding the encapsulation resin forming region 64 and the back surface that is a surface on the opposite side of the top surface. The outline of the wiring board 57 when seen in a plane view includes the first edge.

In the step of clamping the wiring board 57, the wiring board 57 is sandwiched between the lower mold first mold) 52 and the upper mold (the second mold) 51 which is disposed to face the lower mold 52 for clamping the wiring board 57. The upper mold 51 includes the flat portion 60 contacting the peripheral region 73, the recessed portion 53 formed at the location facing the encapsulation resin forming region 64, and the projecting portion 23 formed at a location spaced apart from the recessed portion 53 in the flat portion 60, the projecting portion 23 projecting on the lower mold 52 side, and extending along the first edge of the wiring board 57.

The step of clamping the wiring board 57 includes the step of disposing the wiring board 57 over the lower mold 52 in such a way that the back surface contacts the lower mold 52, and the step of clamping the wiring board 57 by sandwiching the wiring board 57 between the lower mold 52 and the upper mold 51 and contacting the flat portion 60 and the projecting portion 23 with the peripheral region 73.

In the step of encapsulating the semiconductor chip 56 with the encapsulation resin 80, a resin is filled in the recessed portion 53, and the encapsulation resin 80 in the shape corresponding to the recessed portion 53 is formed on the encapsulation resin forming region 64. In the following, the method will be described in detail.

Figure 7:
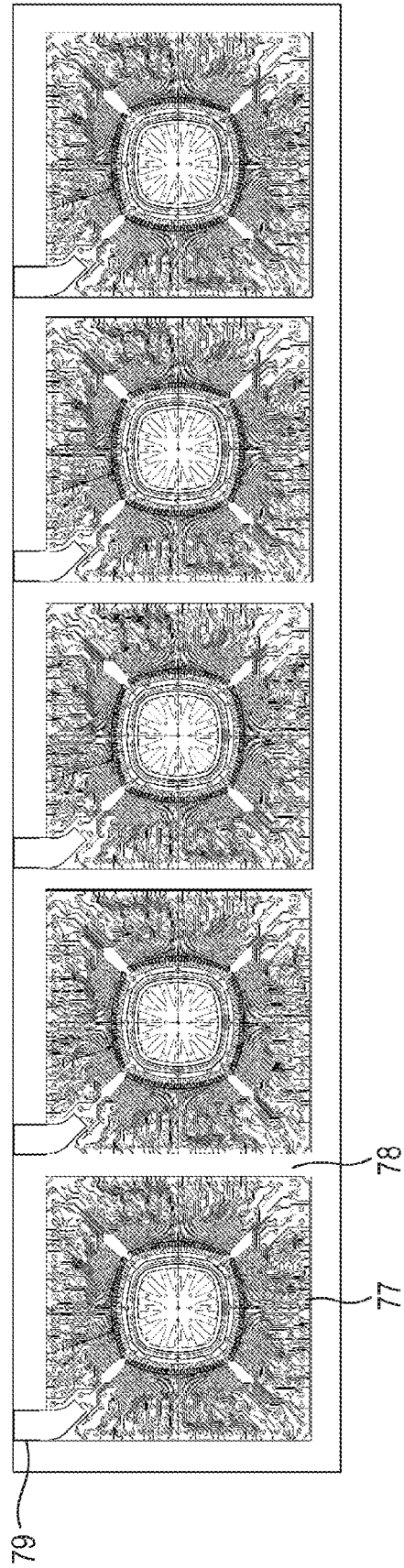
FIG. 7 is a plan view of a processed substrate.

First, a processed substrate illustrated in FIG. 7 is prepared. The processed substrate is formed of a plurality of connected product regions 77 to be the wiring boards 57 of the individual semiconductor devices later and a frame portion 78 that surrounds the product region 77 and couples the product regions 77 to each other. In the case of the corner gate, a gate pattern 79 to be the gate of each of the product regions 77 is formed on the top surface (the chip mounting surface) of the processed substrate from a location corresponding to the cavity to the frame portion 78.

Subsequently, the semiconductor chip 56 is mounted on the wiring board 57. Subsequently, the electrode pad on the top surface of the semiconductor chip 56 (not illustrated) is wire-bonded to the stitch 62 on the wiring board 57 through the bonding wire 61. More specifically, the stitch 62 to which the tip end of the functional interconnection 66 is coupled is wire-bonded to the electrode pad on the semiconductor chip 56.

Subsequently, a structure body thus obtained is placed on the cavity block 54 of the lower mold 52 in such a way that the wiring board 57 is on the lower side. The flat portion 60 of the upper mold 51 is pressed against the top surface of the wiring board 57, and the wiring board 57 is clamped (in the state in FIG. 1). Since the processed substrate has a plurality of the wiring boards 57 (the connected product regions), the upper mold includes a plurality of separate cavities corresponding to the wiring boards 57.

Subsequently, an encapsulation resin is filled in the cavity 50 through the gate 59 (FIGS. 2 and 3), the resin is then cured, and the encapsulation resin 80 (see FIG. 5) is formed. Moreover, the upper mold 51 is separated from the lower mold 52, and the processed substrate having the encapsulation resin 80 formed on the top surface is taken out between the upper mold 51 and the lower mold 52.

Subsequently, the solder ball 68 is formed on the electrode on the back surface of the wiring board 57. Namely, after the step of encapsulating the semiconductor chip 56 with the encapsulation resin 80, a plurality of the solder balls 68 are formed on the back surface of the wiring board 57. Here, the solder balls 68 located on the outermost peripheral portion when seen in a plane view are formed on the portion closer to the encapsulation resin forming region 64 than to the portion in which the projecting portion 23 contacts the wiring board 57 in clamping.

Subsequently, the processed substrate is cut between the wiring boards 57 and separated into dies, so that the individual semiconductor devices are obtained. In the step of separating dies, the wiring boards 57 may be cut and separated into dies by blade dicing. Alternatively, such a configuration may be possible in which the processed substrate is prepared in which the processed substrate is formed with slits in advance along the edges of the wiring boards 57 as a support region is left on the corners of the wiring board 57, and the support region is cut using the molds or the like after forming the solder balls 68 for separating dies. As described above, the processed substrate includes the product regions 77. After forming the solder balls 68 on the back surface of the wiring board 57, the processed substrate is separated into dies for the individual product regions 77. As described above, the semiconductor device according to the embodiment can be obtained.

Here, the semiconductor device manufactured by the manufacturing method according to the embodiment includes the following characteristic. Namely, since the projecting portion 23 is pressed against the top surface of the wiring board 57 in clamping the wiring board 57 using the upper mold 51 and the lower mold 52, the dents 69 are formed on the top surface of the wiring board 57 caused by pressing the projecting portion 23. It is noted that preferably, the solder balls 68 are formed only on the inner side of the dents 69.

It is noted that the manufacturing method according to the embodiment does not aim to suppress resin leakage on the surface of the wiring board 57 on the inner side of the portion in which the projecting portion 23 contacts the wiring board 57 (on the encapsulation resin 80 side). Therefore, a resin leaks into the gap between the wiring board 57 and the flat portion 60 on the inner side of the portion in which the projecting portion 23 contacts the wiring board 57, and as a result, a resin thin film (the thin resin burr 75) is sometimes formed on the surface of the wiring board 57. However, the thin resin burr 75 is prevented from forming on the outer side of the portion in which the projecting portion 23 contacts the surface of the wiring board 57. In other words, the thin resin burr 75 can exist on the inner side of the boundary at the location at which the dent 69 is formed, but is prevented from forming on the outer side of the boundary. Such a configuration may be possible in which in the step of encapsulating the semiconductor chip 56 with the encapsulation resin 80, the thin resin burr 75 is formed on the peripheral region 73 between the projecting portion 23 and the encapsulation resin forming region 64, but is not formed on the peripheral region 73 between the first edge of the wiring board 57 and the projecting portion 23.

The semiconductor device according to the embodiment includes the wiring board 57, the semiconductor chip 56 mounted on the wiring board 57, and the encapsulation resin 80 provided on the wiring board 57 so as to cover the semiconductor chip 56. The wiring board 57 is formed with the dents 69 extending in an annular shape surrounding the encapsulation resin 80; the dent 69 is formed at a location spaced apart from the encapsulation resin 80. Each dent 69 satisfies at least one of the following first to third conditions.
1) The dent 69 is formed on the outer side of the functional wiring area on the wiring board 57.
2) The dent 69 is formed on the outer side of the through hole 63 (63*a*) on the outermost peripheral portion on the wiring board 57.
3) The thin resin bun 75 exists on the encapsulation resin 80 side of the wiring board 57 on the inner side of the dent 69, and the thin resin burr 75 does not exist on the wiring board 57 on the outer side of the dent 69.

According to the first embodiment as described above, the flat portion 60 of the upper mold 51 is provided with the projecting portion 23 projecting on the wiring board 57 side in such a way that the projecting portion 23 extends in an annular shape surrounding the cavity 50. Therefore, since the projecting portion 23 is pressed against the surface of the wiring board 57 in clamping, resin leakage is suppressed to the outer side beyond the portion in which the projecting portion 23 contacts the wiring board 57. In addition to this, since the projecting portion 23 is provided at a location spaced apart from the cavity 50, damage to the functional wiring area of the wiring board 57, by the projecting portion 23, is suppressed. In short, it is possible to combine the suppression of resin leakage with the suppression of damage to the functional wiring area of the wiring board 57 in forming the encapsulation resin 80. It is noted that since the functional interconnection 66 does not exist other than in the functional wiring area, it is unnecessary to consider faulty electrical characteristics caused by the breakage of electric wires even through cracks are formed on the wiring board 57. It is noted that since the projecting portion 23 is provided on the flat portion 60 of the upper mold 51, it is unnecessary to provide any moving mechanisms to move the projecting portion 23 other than moving mechanisms that move the upper mold 51 relative to the lower mold 52.

If the projecting portion 23 is disposed adjacent to the encapsulation resin forming region 64 (i.e., not spaced apart therefrom), the projecting portion 23 contacts the wiring board 57 at least on the cavity 50 side of the projecting portion 23, and there is no component to press the wiring board 57, so that a pressure is concentrated on the region of the projecting portion 23, and the interconnection is prone to be damaged. In the embodiment, the flat portion 60 contacting the wiring board 57 is provided between the cavity 50 and the projecting portion 23, so that this problem can be solved. Moreover, since the region on which a pressure is concentrated can be disposed on the peripheral portion of the wiring board 57, such a semiconductor device can be obtained in which the functional interconnection 66 is unlikely to be damaged. The encapsulation resin is not formed in the region in which the flat portion 60 contacts the wiring board 57 between the cavity 50 and the projecting portion 23. In other words, it is possible to obtain a semiconductor device that combines the suppression of resin leakage with the suppression of damage to the substrate because the semiconductor device includes the encapsulation resin forming region 64 (the cavity 50), the region with no encapsulation resin (the flat portion 60), and the dent 69, formed in this order.

Moreover, the wiring board 57 includes the base substrate 70 formed with the through holes 63, the interconnection 71*a* formed on the base substrate 70 and on the top surface side, and the solder resist 72 formed on the interconnection 71*a*. The dents 69 are formed on the solder resist 72. The through holes 63 include the first through hole 63*a* located in the peripheral region 73 and on the encapsulation resin forming region 64 side on the inner side of the dent 69 when seen in a plane view. Thus, the through holes 63 can be disposed in the functional wiring area, and the design constraint of the wiring board 57 can be made smaller as well as the reliability of the semiconductor device can be improved.

Furthermore, since the depth of the dent 69 is shallower than the thickness of the solder resist 72 over the interconnection 71*a*, such a semiconductor device can be obtained in the structure in which damage to the interconnection 71*a* is suppressed.

In addition, the wiring board 57 includes the stitch 62 in the encapsulation resin forming region 64. The interconnection 71b extends from the stitch 62 to the first through hole. The wiring board 57 further includes the plating wire 65 reaching the first edge of the wiring board 57 from the first through hole in the peripheral region 73. In other words, the interconnection 71a (the functional interconnection) extends on the inner side of the region on the wiring board 57 in which the projecting portion 23 contacts the wiring board 57, and the plating wire 65 is disposed as crossing the region on the wiring board 57 in which the projecting portion 23 contacts the wiring board 57; the plating wire 65 does not directly affect the operation of the semiconductor device when the plating wire 65 is damaged. Thus, the design constraint of the wiring board 57 can be made smaller as well as the reliability of the semiconductor device can be improved.

Moreover, the encapsulation resin forming region 64 is an octagon alternately having a long side 64a and an angled short side 64b, in which the first long side of the octagon and the first edge 57a of the wiring board 57 are located on the same side relative to the encapsulation resin forming region 64 and are in parallel with each other when seen in a plane view. The dent 69 and the first long side 64a extend in parallel with each other. In other words, the dent 69 linearly extends along the outer edge 57a of the wiring board 57. Thus, the region in which the dent 69 is formed can be limited to a narrow region on the outermost peripheral portion of the wiring board 57. This means that the dent 69 can be formed in a region at which a distance from the first edge 57a is constant, and the dent 69 need not reach the through hole 63. Furthermore, since a distance from the long side 64a of the encapsulation resin forming region 64 to the outer edge 57a of the wiring board 57 is shorter than a distance from the angled short side 64a of the encapsulation resin forming region 64 to the end portion of the wiring board 57, the thin resin bun 75 is prone to reach the end portion of the wiring board 57 even in the case where a thin resin burr 75 of the same length is formed. And if the thin resin burr 75 reaches the end portion of the wiring board, it is more likely to fall or break during the manufacturing process steps, leading to complications.

In addition, on the wiring board 57 formed with slits, when the thin resin bun 75 reaches the lower mold 52, it is likely that the thin resin burr 75 is formed on the back surface of the wiring board 57, or the function of the lower mold 52 is impaired. In the embodiment, these problems can be suppressed.

Moreover, the dent 69 extends in parallel with the first edge. This has advantages in that a wider functional wiring area can be secured, and also the same mold can be shared between a plurality of products.

Furthermore, a first distance between the first long side 64a of the encapsulation resin forming region 64 and the dent 69 is longer than a second distance between the first edge 57a of the wiring board 57 and the dent 69. Thus, since the dent 69 is formed close to the first edge 57a of the wiring board 57 (the outer edge), the possibility of damaging the functional interconnection 66 can be reduced, and a wide functional wiring area can be secured.

In addition, on the wiring board 57, the region in which the dent 69 is not formed exists in at least a part of the region corresponding to the angled short side 64b of the encapsulation resin forming region 64. Thus, even though the gate 59, the air vent 58, and the like are formed on the angled short side of the encapsulation resin forming region 64, the flowability of a resin air can be secured.

Moreover, the semiconductor device includes the solder balls 68. The solder balls 68 located on the outermost peripheral portion when seen in a plane view are located on the encapsulation resin forming region 64 side on the inner side of the dent 69. Thus, since the dent 69 is formed close to the first edge 57a of the wiring board 57 (the outer edge), the possibility of damaging the functional interconnection 66 can be reduced, and a wide functional wiring area can be secured.

It is noted that preferably, the length of the projecting portion 23 is ten times the width (the thickness) of the projecting portion 23, or more. Thus, the functional wiring area can be secured as wide as possible, and the effect of concentrating a pressure on the projecting portion 23 can be obtained. When the projecting portion 23 is too thick, the effect of concentrating a pressure is not obtained. Furthermore, preferably, the length of the projecting portion 23 is longer than the length of the long side of the encapsulation resin forming region 64.

Second Embodiment

Figure 8:
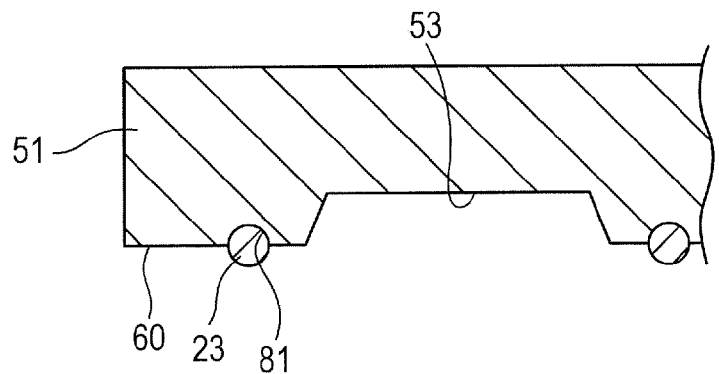
FIG. 8 is a cross sectional view of a second mold of a semiconductor device mold according to a second embodiment.

FIG. 8 is a cross sectional view of a second mold of a semiconductor device mold according to a second embodiment (an upper mold 51, for example).

In the first embodiment, an example is described in which the entire upper mold 51 including the projecting portion 23 is formed integrally with a metal, to have unitary one-piece construction.

On the contrary, in the second embodiment, as illustrated in FIG. 8, a projecting portion 23 includes a material having a modulus of elasticity smaller than the modulus of elasticity of an upper mold 51, and mounted on a flat portion 60. It is noted that in the case of the second embodiment, it is unnecessary for the projecting portion 23 to be spaced apart from the cavity 50, and so the projecting portion 23 may be disposed at a location adjacent to the cavity 50.

The projecting portion 23 is formed of an O-ring, for example, and fit into a mounting recessed portion 81 formed on the lower surface of the flat portion 60 of the upper mold 51, and fixed to the mounting recessed portion 81. It is noted that such a configuration may be possible in which the projecting portion 23 is formed flat on the flat portion 60 side, for example, (the projecting portion 23 is formed in a semicircular shape in the cross section, for example), and bonded to the flat portion 60.

Here, a material having the lowest modulus of elasticity among materials forming the wiring board 57 is a solder resist 72. Since the modulus of elasticity of the solder resist 72 is at 2 to 5 GPa at a temperature of 25° C., preferably, the projecting portion 23 includes a material having a modulus of elasticity lower than the modulus of elasticity of the solder resist 72. More specifically, preferably, the modulus of elasticity of the projecting portion 23 is 1 GPa or less. Moreover, the projecting portion 23 has heat-resisting properties such that the projecting portion 23 does not melt due to the heat associated with filling a resin. More specifically, the projecting portion 23 can include polyimide, silicone rubber, or fluorine rubber, for example.

Furthermore, preferably, the projecting portion 23 is attachable/detachable to/from the mounting recessed portion 81. Thus, projecting portions 23 in different projecting amounts can be mounted according to the type or the like of a semiconductor device to be manufactured. It is noted that in order to mount the projecting portion 23 in different projecting amounts on the mounting recessed portion 81 in the same shape, such a configuration is named, for example, in which a projecting portion 23 in a circular shape in the cross section with a relatively small projecting amount and a projecting portion 23 in a long circular (e.g., oval) shape in the cross section with a relatively large projecting amount are mounted.

According to the second embodiment as described above, the effect similar to the effect of the first embodiment can be obtained. It is noted that in the case of the second embodiment, in clamping, the projecting portion 23 is deformed to absorb micro projections and depressions on the surface of the wiring board 57 rather than deforming the wiring board 57, so that resin leakage and the cracking or the like of the wiring board 57 can be suppressed. Moreover, in the case of the second embodiment, it is unnecessary for the projecting portion 23 to be spaced apart from the cavity 50, and so the projecting portion 23 can be disposed in the functional wiring area, so that the functional wiring area of the wiring board 57 can be increased as compared with the first embodiment.

Third Embodiment

Figure 9A:
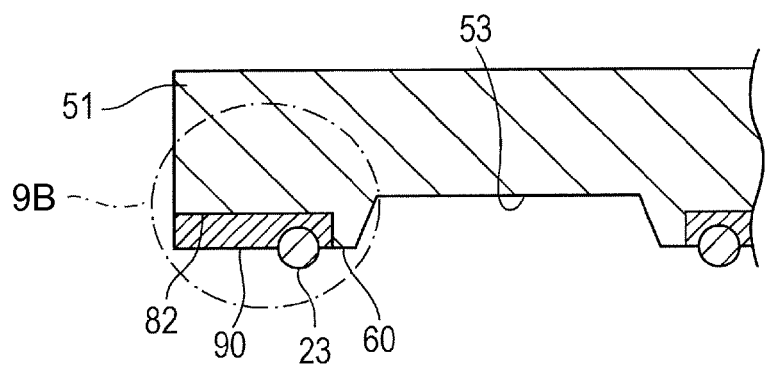
FIGS. 9A and 9B are cross sectional views of a second mold of a semiconductor device mold according to a third embodiment.
Figure 9B:
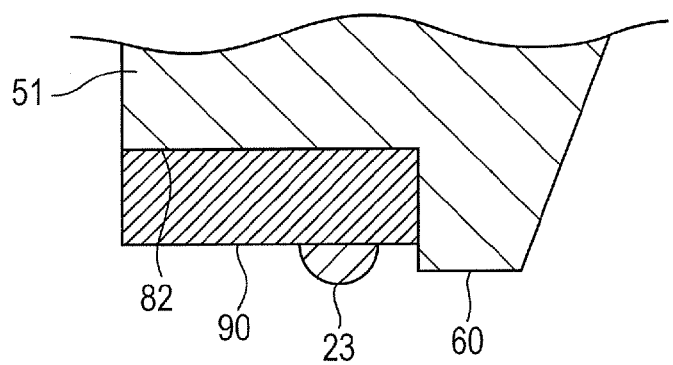

FIG. 9A is a cross sectional view of a second mold of a semiconductor device mold according to a third embodiment (an upper mold 51, for example), and FIG. 9B is an enlarged diagram of a portion 9B in FIG. 9A.

In the second embodiment, an example is described in which only the projecting portion 23 is a member separate from the upper mold 51. In the third embodiment, a projecting portion 23 is mounted on the upper mold 51 through a mounting base member 90. Here, preferably, the mounting base member 90 is attachable/detachable to/from the upper mold 51.

The mounting base member 90 is rectangular in the cross section, for example, and the plane form is a rectangular frame, for example. The mounting base member 90 is mounted on a recessed portion 82 formed on the upper mold 51.

The lower surface of the mounting base member 90 may be located above a flat portion 60 (the example in FIG. 9A), or may be below the flat portion 60. However, in any case, the projecting portion 23 projects below the flat portion 60. The amount of the projecting portion 23 projecting from the flat portion 60 can be adjusted by disposing a shim (a spacer) having an appropriate thickness between the recessed portion 82 and the mounting base member 90.

As illustrated in FIG. 9B, in the upper mold 51, the portion of the mounting base member 90 around the projecting portion 23 may be one step lower than the projecting portion 23, but this portion contacts a wiring board 57 during clamping.

The method of fixing the mounting base member 90 to the upper mold 51 is not limited particularly. For example, the mounting base member 90 is fixed to the upper mold 51 using a fixing member such as a bolt, or by press fitting.

According to the third embodiment as described above, the effect similar to the effect of the second embodiment can be obtained. Moreover, the mounting base member 90 is selected to adjust the amount that the projecting portion 23 projects.

In the embodiments, an example is described in which the projecting portion 23 has a circular shape in the cross section (the shape of the portion which projects has a semicircular shape in the cross section). However, the cross sectional shape of the projecting portion 23 may be have some other shape, such as an ellipse, a long circle (oval), a trapezoid, a triangle, a quadrilateral, or other polygon.

Furthermore, in the embodiments, an example is described in which the projecting portion 23 is disposed in a continuous annular shape on the portion other than the location at which the air vent 58 is formed. However, the projecting portion 23 is not necessarily disposed continuously on the portion other than the location at which the air vent 58 is formed. For example, the projecting portion 23 may include intermitted blanks along its length in the plane view of the extending direction.

In addition, in the embodiments, an example is described in which the projecting portion 23 is disposed in a single annular shape. The projecting portion 23 may be disposed so as to surround the cavity 50 in a multiple-annular shape, i.e., through a plurality of concentric annular shapes in the plane view.

Moreover, in the second and third embodiments, an example is described in which the entire projecting portion 23 is formed of a material having a modulus of elasticity smaller than the modulus of elasticity of the upper mold 51. However, such a configuration may be possible in which a material having a modulus of elasticity smaller than the modulus of elasticity of the upper mold 51 is applied on the front layer of the projecting portion 23 formed as a part of the upper mold 51 as similar to the first embodiment, so that the modulus of elasticity of (the front layer of) the projecting portion 23 is made smaller than the modulus of elasticity of the upper mold 51.

Furthermore, in the embodiments, an example is described in which the upper mold 51 is formed with the recessed portion 53 and the flat portion 60, and the flat portion 60 is provided with the projecting portion 23. However, the configuration of the upper mold 51 and the configuration of the lower mold 52 switched with each other. Namely, the upper mold 51 may be the first mold, and the lower mold 52 may be the second mold. In addition, in the embodiments, an example of wire coupling is shown. A so-called flip coupling is possible in which a bump formed on the surface of a semiconductor chip is coupled to a wiring board through solder.

It is noted that the above embodiments disclose the following aspects, which aspects are described through a plurality of additional paragraphs.

Additional Paragraph 1

A semiconductor device mold includes: a first mold contacting the back surface of a wiring board on which a semiconductor chip is mounted in clamping; and a second mold facing the first mold. The second mold includes: a recessed portion forming a cavity surrounding the semiconductor chip in the clamping; and a flat portion contacting the surface of the wiring board on a portion around the cavity in the clamping. The flat portion is provided with a projecting portion projecting on the wiring board side at a location spaced apart from the cavity so that the projecting portion extends in an annular shape surrounding the portion around the cavity.

Additional Paragraph 2

The semiconductor device mold according to additional Paragraph 1, in which the projecting portion is disposed at a location at which the projecting portion contacts a portion on the outer side of a functional wiring area over the wiring board.

Additional Paragraph 3

The semiconductor device mold according to additional Paragraph 1 or 2, in which the projecting portion is disposed at a location at which the projecting portion contacts a portion on the outer side of a through hole on the outermost peripheral portion over the wiring board.

Additional Paragraph 4

The semiconductor device mold according to any one of additional Paragraphs 1 to 3, in which the projecting portion is disposed at a location spaced apart from the recessed portion by 0.5 mm or more.

Additional Paragraph 5

The semiconductor device mold according to any one of additional Paragraphs 1 to 4, in which the projecting portion is formed integrally with the first mold.

Additional Paragraph 6

The semiconductor device mold according to any one of additional Paragraphs 1 to 5, in which the projecting portion is formed of a material having the modulus of elasticity smaller than the modulus of elasticity of the first mold, and the projecting portion is mounted on the flat portion.

Additional Paragraph 7

A semiconductor device mold includes: a first mold contacting the back surface of a wiring board on which a semiconductor chip is mounted in clamping; and a second mold facing the first mold. The second mold includes: a recessed portion forming a cavity surrounding the semiconductor chip in the clamping; and a flat portion contacting the surface of the wiring board on the portion around the cavity in the clamping. The flat portion is mounted with a projecting portion formed of a material having the modulus of elasticity smaller than the modulus of elasticity of the first mold, the projecting portion projecting on the wiring board side so that the projecting portion extends in an annular shape surrounding the portion around the cavity.

Additional Paragraph 8

The semiconductor device mold according to additional Paragraph 6 or 7, in which the projecting portion is attachable/detachable to/from the flat portion.

Additional Paragraph 9

The semiconductor device mold according to any one of additional Paragraphs 6 to 8, in which the modulus of elasticity of the projecting portion is 1 GPa or less.

Additional Paragraph 10

The semiconductor device mold according to any one of additional Paragraphs 1 to 9, in which the flat portion is mirror-finished, and the amount of the projecting portion projecting is 1 μm or more.

Additional Paragraph 11

The semiconductor device mold according to any one of additional Paragraphs 1 to 9, in which the flat portion is satin-finished, and the amount of the projecting portion projecting is 5 μm or more.

Additional Paragraph 12

The semiconductor device mold according to any one of additional Paragraphs 1 to 11, in which the amount of the projecting portion projecting is 30 μm or less.

Additional Paragraph 13

The semiconductor device mold according to any one of additional Paragraphs 1 to 12, in which the projecting portion is disposed in a multiple-annular shape.

What is claimed is:

1. A method for manufacturing a semiconductor device comprising the steps of:
    preparing a wiring board having opposite first and second surfaces, the first surface including a first region and a second region surrounding the first region, the wiring board when seen in a plane view including a first edge;
    mounting a semiconductor device over the first region;
    clamping the wiring board having the semiconductor device mounted thereover with a first mold and a second mold facing the first mold; and
    encapsulating the clamped semiconductor device over the wiring board with an encapsulation resin,
    wherein the second mold includes: a flat portion contacting the second region, a recessed portion formed at a location facing the first region, and a projecting portion formed at a location spaced apart from the recessed portion on the flat portion, the projecting portion projecting on the first mold side, and extending along the first edge;
    wherein the wiring board includes:
        a base substrate formed with a plurality of through holes;
        a first interconnection formed over the base substrate on the first surface side; and
        a first insulating film formed over the first interconnection;
    wherein the through holes include a first through hole located in the second region and on the first region side on an inner side of the projecting portion when seen in a plane view;
    wherein the step of clamping the wiring board includes the steps of:
        disposing the wiring board over the first mold so that the second surface contacts the first mold; and
        contacting the flat portion and the projecting portion of the second mold with the second region of the wiring board;
    wherein, in the clamping step, the projecting portion presses the first insulating film and forms a dent on the first insulating film; and
    wherein in the step of encapsulating the semiconductor device with the encapsulation resin, the resin is introduced into the recessed portion and forms a shape corresponding to the recessed portion over the first region, with the projecting portion of the second mold serving as a resin dam.

2. The method for manufacturing a semiconductor device according to claim 1,
    wherein a height of the projecting portion projecting from the flat portion is shorter than a thickness of the first insulating film over the first interconnection.

3. The method for manufacturing a semiconductor device according to claim 1,
    wherein the wiring board includes a first electrode terminal in the first region;
    wherein the first interconnection extends from the first electrode terminal to the first through hole; and
    wherein the wiring board further includes a second interconnection in the second region, the second interconnection reaching the first edge from the first through hole.

4. The method for manufacturing a semiconductor device according to claim 1,
    wherein the first region is an octagon having long sides alternating with short sides;
    wherein when seen in a plane view, a first long side of the octagon and the first edge of the wiring board are parallel to each other and located on a same side relative to the recessed portion; and
    wherein the projecting portion and the first long side extend in parallel with each other.

5. The method for manufacturing a semiconductor device according to claim 4,
    wherein a first distance between the first long side and the projecting portion is longer than a second distance between the first edge and the projecting portion.

6. The method for manufacturing a semiconductor device according to claim 4,
    wherein in the second mold, the projecting portion is not formed in at least a part of a region facing the short side of the first region.

7. The method for manufacturing a semiconductor device according to claim 1, comprising:

forming a plurality of external terminals on the second surface, after the step of encapsulating the semiconductor device with the encapsulation resin.

8. The method for manufacturing a semiconductor device according to claim 7,
wherein when seen in a plane view, the external terminal located on an outermost peripheral portion of the second surface is formed in the first region on an inner side of a portion where the projecting portion contacts the wiring board in during the clamping step.

9. The method for manufacturing a semiconductor device according to claim 7,
wherein the wiring board includes a plurality of connected product regions; and
wherein after the step of forming a plurality of external terminals on the second surface, the wiring board is separated into individual product regions.

10. The method for manufacturing a semiconductor device according to claim 1,
wherein in the step of encapsulating the semiconductor device with the encapsulation resin, a thin resin burr is formed over the second region between the projecting portion and the first region, the thin resin burr not being formed over the second region on the first edge side of the projecting portion.

11. A method for manufacturing a semiconductor device comprising the steps of:
preparing a wiring board having opposite first and second surfaces, the first surface including a first region and a second region surrounding the first region, the wiring board when seen in a plane view including a first edge;
mounting a semiconductor device over the first region;
clamping the wiring board having the semiconductor device mounted thereover with a first mold and a second mold facing the first mold; and
encapsulating the clamped semiconductor device over the wiring board with an encapsulation resin;
wherein the second mold includes: a flat portion contacting the second region, a recessed portion formed at a location facing the first region, and a projecting portion formed at a location spaced apart from the recessed portion on the flat portion, the projecting portion projecting on the first mold side, and extending along the first edge;
wherein the step of clamping the wiring board includes the steps of:
disposing the wiring board over the first mold so that the second surface contacts the first mold; and
contacting the flat portion and the projecting portion of the second mold with the second region of the wiring board;
wherein in the step of encapsulating the semiconductor device with the encapsulation resin, the resin is introduced into the recessed portion and forms a shape corresponding to the recessed portion over the first region, with the projecting portion of the second mold serving as a resin dam; and
after said encapsulating step, further comprising the step of forming a plurality of external terminals on the second surface, wherein when seen in a plane view, the external terminal located on an outermost peripheral portion of the second surface is formed in the first region on an inner side of a portion where the projecting portion contacts the wiring board in during the clamping step.

12. The method for manufacturing a semiconductor device according to claim 11,
wherein the wiring board includes:
a base substrate formed with a plurality of through holes;
a first interconnection formed over the base substrate on the first surface side; and
a first insulating film formed over the first interconnection;
wherein the through holes include a first through hole located in the second region and on the first region side on an inner side of the projecting portion when seen in a plane view;
wherein, in the clamping step, the projecting portion presses the first insulating film and forms a dent on the first insulating film; and
wherein a height of the projecting portion projecting from the flat portion is shorter than a thickness of the first insulating film over the first interconnection.

13. The method for manufacturing a semiconductor device according to claim 11,
wherein the wiring board includes:
a base substrate formed with a plurality of through holes;
a first interconnection formed over the base substrate on the first surface side; and
a first insulating film formed over the first interconnection;
wherein the through holes include a first through hole located in the second region and on the first region side on an inner side of the projecting portion when seen in a plane view;
wherein, in the clamping step, the projecting portion presses the first insulating film and forms a dent on the first insulating film;
wherein the wiring board includes a first electrode terminal in the first region;
wherein the first interconnection extends from the first electrode terminal to the first through hole; and
wherein the wiring board further includes a second interconnection in the second region, the second interconnection reaching the first edge from the first through hole.

14. The method for manufacturing a semiconductor device according to claim 11,
wherein the first region is an octagon having long sides alternating with short sides;
wherein when seen in a plane view, a first long side of the octagon and the first edge of the wiring board are parallel to each other and located on a same side relative to the recessed portion; and
wherein the projecting portion and the first long side extend in parallel with each other.

15. The method for manufacturing a semiconductor device according to claim 14,
wherein a first distance between the first long side and the projecting portion is longer than a second distance between the first edge and the projecting portion.

16. The method for manufacturing a semiconductor device according to claim 14,
wherein in the second mold, the projecting portion is not formed in at least a part of a region facing the short side of the first region.

17. The method for manufacturing a semiconductor device according to claim 11,
wherein the wiring board includes a plurality of connected product regions; and
wherein after the step of forming a plurality of external terminals on the second surface, the wiring board is separated into individual product regions.

18. The method for manufacturing a semiconductor device according to claim 11, wherein in the step of encapsulating the semiconductor device with the encapsulation resin, a thin resin burr is formed over the second region between the projecting portion and the first region, the thin resin burr not being formed over the second region on the first edge side of the projecting portion.

19. A method for manufacturing a semiconductor device comprising the steps of:
preparing a wiring board having opposite first and second surfaces, the first surface including a first region and a second region surrounding the first region, the wiring board when seen in a plane view including a first edge;
mounting a semiconductor device over the first region;
clamping the wiring board having the semiconductor device mounted thereover with a first mold and a second mold facing the first mold; and
encapsulating the clamped semiconductor device over the wiring board with an encapsulation resin,
wherein the second mold includes: a flat portion contacting the second region, a recessed portion formed at a location facing the first region, and a projecting portion formed at a location spaced apart from the recessed portion on the flat portion, the projecting portion projecting on the first mold side, and extending along the first edge;
wherein the step of clamping the wiring board includes the steps of:
disposing the wiring board over the first mold so that the second surface contacts the first mold; and
contacting the flat portion and the projecting portion of the second mold with the second region of the wiring board; and
wherein in the step of encapsulating the semiconductor device with the encapsulation resin:
the resin is introduced into the recessed portion and forms a shape corresponding to the recessed portion over the first region, with the projecting portion of the second mold serving as a resin dam; and
a thin resin burr is formed over the second region between the projecting portion and the first region, the thin resin burr not being formed over the second region on the first edge side of the projecting portion.

20. The method for manufacturing a semiconductor device according to claim 19,
wherein the wiring board includes:
a base substrate formed with a plurality of through holes;
a first interconnection formed over the base substrate on the first surface side; and
a first insulating film formed over the first interconnection;
wherein the through holes include a first through hole located in the second region and on the first region side on an inner side of the projecting portion when seen in a plane view;
wherein, in the clamping step, the projecting portion presses the first insulating film and forms a dent on the first insulating film; and
wherein a height of the projecting portion projecting from the flat portion is shorter than a thickness of the first insulating film over the first interconnection.

21. The method for manufacturing a semiconductor device according to claim 19,
wherein the wiring board includes:
a base substrate formed with a plurality of through holes;
a first interconnection formed over the base substrate on the first surface side; and
a first insulating film formed over the first interconnection;
wherein the through holes include a first through hole located in the second region and on the first region side on an inner side of the projecting portion when seen in a plane view;
wherein, in the clamping step, the projecting portion presses the first insulating film and forms a dent on the first insulating film;
wherein the wiring board includes a first electrode terminal in the first region;
wherein the first interconnection extends from the first electrode terminal to the first through hole; and
wherein the wiring board further includes a second interconnection in the second region, the second interconnection reaching the first edge from the first through hole.

22. The method for manufacturing a semiconductor device according to claim 19,
wherein the first region is an octagon having long sides alternating with short sides;
wherein when seen in a plane view, a first long side of the octagon and the first edge of the wiring board are parallel to each other and located on a same side relative to the recessed portion; and
wherein the projecting portion and the first long side extend in parallel with each other.

23. The method for manufacturing a semiconductor device according to claim 22,
wherein a first distance between the first long side and the projecting portion is longer than a second distance between the first edge and the projecting portion.

24. The method for manufacturing a semiconductor device according to claim 22,
wherein in the second mold, the projecting portion is not formed in at least a part of a region facing the short side of the first region.

25. The method for manufacturing a semiconductor device according to claim 19,
wherein the wiring board includes a plurality of connected product regions; and
wherein after the step of forming a plurality of external terminals on the second surface, the wiring board is separated into individual product regions.

26. A method for manufacturing a semiconductor device comprising the steps of:
preparing a wiring board having opposite first and second surfaces, the first surface including a first region and a second region surrounding the first region, the wiring board when seen in a plane view including a first edge;
mounting a semiconductor device over the first region;
clamping the wiring board having the semiconductor device mounted thereover with a first mold and a second mold facing the first mold; and
encapsulating the clamped semiconductor device over the wiring board with an encapsulation resin;
wherein the second mold includes: a flat portion contacting the second region, a recessed portion formed at a location facing the first region, and a projecting portion formed at a location spaced apart from the recessed portion on the flat portion, the projecting portion projecting on the first mold side, and extending along the first edge;
wherein the step of clamping the wiring board includes the steps of:
disposing the wiring board over the first mold so that the second surface contacts the first mold; and contacting the flat portion and the projecting portion of the second mold with the second region of the wiring board;

wherein in the step of encapsulating the semiconductor device with the encapsulation resin, the resin is introduced into the recessed portion and forms a shape corresponding to the recessed portion over the first region, with the projecting portion of the second mold serving as a resin dam;

wherein the first region is an octagon having long sides alternating with short sides;

wherein when seen in a plane view, a first long side of the octagon and the first edge of the wiring board are parallel to each other and located on a same side relative to the recessed portion;

wherein the projecting portion and the first long side extend in parallel with each other; and wherein a first distance between the first long side and the projecting portion is longer than a second distance between the first edge and the projecting portion.

27. A method for manufacturing a semiconductor device comprising the steps of:
preparing a wiring board having opposite first and second surfaces, the first surface including a first region and a second region surrounding the first region, the wiring board when seen in a plane view including a first edge;
mounting a semiconductor device over the first region;
clamping the wiring board having the semiconductor device mounted thereover with a first mold and a second mold facing the first mold; and
encapsulating the clamped semiconductor device over the wiring board with an encapsulation resin;

wherein the second mold includes: a flat portion contacting the second region, a recessed portion formed at a location facing the first region, and a projecting portion formed at a location spaced apart from the recessed portion on the flat portion, the projecting portion projecting on the first mold side, and extending along the first edge;

wherein the step of clamping the wiring board includes the steps of:
disposing the wiring board over the first mold so that the second surface contacts the first mold; and
contacting the flat portion and the projecting portion of the second mold with the second region of the wiring board;

wherein in the step of encapsulating the semiconductor device with the encapsulation resin, the resin is introduced into the recessed portion and forms a shape corresponding to the recessed portion over the first region, with the projecting portion of the second mold serving as a resin dam;

wherein the first region is an octagon having long sides alternating with short sides;

wherein when seen in a plane view, a first long side of the octagon and the first edge of the wiring board are parallel to each other and located on a same side relative to the recessed portion;

wherein the projecting portion and the first long side extend in parallel with each other; and wherein in the second mold, the projecting portion is not formed in at least a part of a region facing the short side of the first region.

* * * * *